United States Patent [19]
Goetz et al.

[11] Patent Number: 5,973,417
[45] Date of Patent: Oct. 26, 1999

[54] CIRCUIT ARRANGEMENT FOR A SENSOR ELEMENT

[75] Inventors: Bernhard Goetz, Zaisenhausen; Ivo Russ, Oberderdingen, both of Germany

[73] Assignee: E.G.O. Elektro-Geraetebau GmbH, Germany

[21] Appl. No.: 09/024,574

[22] Filed: Feb. 17, 1998

[30] Foreign Application Priority Data

Feb. 17, 1997 [DE] Germany .......................... 197 06 167
Nov. 29, 1997 [DE] Germany .......................... 297 21 213

[51] Int. Cl.$^6$ ................................................. H01H 35/00
[52] U.S. Cl. .............................................. 307/129; 307/116
[58] Field of Search .................................... 307/112, 113, 307/116, 117, 125, 139, 129

[56] References Cited

U.S. PATENT DOCUMENTS

| | | |
|---|---|---|
| 4,380,007 | 4/1983 | Steinegger . |
| 5,012,124 | 4/1991 | Hollaway .............................. 307/116 |
| 5,189,417 | 2/1993 | Caldwell et al. . |
| 5,673,041 | 9/1997 | Chatigny et al. . |
| 5,796,183 | 8/1998 | Hourmand .............................. 307/116 |

FOREIGN PATENT DOCUMENTS

| | | |
|---|---|---|
| 06 75 600 | 2/1995 | European Pat. Off. . |
| 27 48 806 | 6/1978 | Germany . |
| 27 23 558 | 12/1978 | Germany . |
| 38 23 018 | 1/1990 | Germany . |
| 41 25 444 | 2/1993 | Germany . |

*Primary Examiner*—Richard T. Elms
*Attorney, Agent, or Firm*—Quarles & Brady

[57] ABSTRACT

A circuit arrangement (11) has an activating circuit (13) for a sensor element (12) of a touch contact switch, which in one embodiment of the invention contains a frequency generator (16). The frequency generator (16) generates a frequency-modulated activating signal (17), which is applied to the sensor element (12). In another embodiment the forming of the activating signal (17) takes place in a microcontroller (48), containing eventually the activating part (13) and or the evaluation of the signal. Through passing through a large frequency range for the activating signal (17), the influence of extraneous signals, even when using a lower signal voltage, is minimized.

30 Claims, 4 Drawing Sheets

CIRCUIT ARRANGEMENT FOR A SENSOR ELEMENT

FIELD OF APPLICATION AND PRIOR ART

The invention relates to a circuit arrangement for at least one sensor element of at least one touch contact switch, in which an activating signal is applied to the sensor element and is variable as a function of the operating state of the sensor element.

Nowadays, touch contact switches are used in numerous electrical appliances, particularly domestic appliances. By simply touching the switch, which usually has a metal surface, the user can initiate a desired switching process.

In known touch contact switches having a sensor element a wiring is provided applying to the sensor element a usually high frequency a.c. voltage, which is modified on operating the contact switch. This modification is detected and triggers a switching signal. However, considerable problems arise with interference, superimposed in interfering manner on the signal. These interference phenomena firstly emanate from the voltage supply from the mains, because as a result of the increasing number of electrical appliances there has been a marked increase in so-called electrosmog. This means that on the mains voltage are superimposed numerous spurious or extraneous signals. In addition, extraneous signals are emitted by other appliances, particularly in the home, such as televisions, computers and mobile telephones, which are superimposed in interfering manner on the signal on the sensor element.

Therefore attempts have already been made by increasing the applied signal voltage from 5 V (standard supply voltage of electronic circuits) to 20 or 30 V to generate a stronger signal which is insensitive to such interference. This means that it is necessary to have a second voltage supply, but also it has not given a complete solution to the indicated problems.

PROBLEM AND SOLUTION

The problem of the invention is to provide an improved circuit arrangement for a sensor element of a touch contact switch, which is not susceptible to extraneous signals and in particular requires no additional voltage supply.

This problem is solved in that the activating signal is a modulated, particularly frequency-modulated activating signal. Preferably it periodically passes through a given frequency range, so that extraneous signals, which in each case have a given, fixed frequency, only very briefly occur synchronously with the activating signal. Due to the fact that the evaluation can be made such that it only recognizes as switching state modifications signal level modifications occurring over a longer time period or a certain frequency range, no part is played by extraneous signals having a different or a fixed frequency. In addition, extraneous signals usually only occur in specific frequency ranges and said ranges are only briefly covered on passing through a broad, much wider frequency range.

The circuit arrangement comprises at least one activating part, a sensor part and an evaluating part and in particular each sensor element has an associated sensor part, preferably a sensor circuit. As a result of this subdivision it is possible to combine several touch contact switches with a single activating part and a single evaluating part. In full operation the number of components and therefore costs and fault susceptibility can be reduced.

Preferably a working or operating frequency generated in the activating part and having a fixed frequency sweep can be periodically variable between a minimum value and a maximum value, the minimum value being approximately 5 kHz and the maximum value approximately 50 kHz. The modulation frequency is advantageously approximately 20 to 1000 Hz. Through the broad frequency range of 5 to 50 kHz, it is ensured that adequate ranges are traversed where there are no extraneous signals. This in particular excludes low frequency interference, e.g. mains frequency harmonics. The fixed modulation frequency ensures that there is an adequately fast passage through the frequency range. The costs of such a frequency generation are only insignificantly higher than for a fixed output frequency.

In particularly preferred manner the activating signal is a square-wave signal, particularly such a signal having a make-to-break ratio of approximately 70 to 95% and a signal level of approximately 5 V. The high make-to-break ratio ensures that the zero level duration is not excessive, so that the d.c. voltage finally obtained is adequately high. Through the use of a 5 V signal level, the operating voltage used for the electronic components can be employed and consequently no further voltage supply is needed. Thus, costs are reduced, operational reliability increased and interfering influences caused by a further voltage supply avoided.

Advantageously a component, particularly a feed capacitor, forms a part of a voltage divider, particularly a capacitive voltage divider, the sensor element forming the other or second part of the voltage divider. The touch contact switch is operated by means of the finger capacity of the user and therefore a capacitive voltage divider is advantageous. By means of such a voltage divider, it is possible in a very simple manner by monitoring the partial voltages to detect a change to one of the two capacitances, in this case the sensor capacitance. The feed capacitor must have a constant capacitance.

In order to permit the activation of several sensor parts with a single activating part, the component forming the first part of the voltage divider is contained in the sensor part. By means of branch lines, which emanate from a feed branch point or junctions, the sensor parts are connectable to the activating part, so that the same activating signal is applied to all sensor parts.

Preferably a filter, particularly a R-C filter is connected upstream of the sensor part output. As a result of this filter the sensor element signal is converted into a d.c. voltage, which is dependent on the make-to-break ratio, the signal level and the operating state of the contact switch. As the first two quantities are fixed, through an evaluation of the d.c. voltage it is possible to detect an operation of the contact switch. Such a filter can be constructed without significant cost and the resulting d.c. voltage is evaluatable with simple means. In order to avoid interference, it is advantageous to have a filter in each sensor part.

The circuit arrangement advantageously contains switching means, constructed for short-circuiting in each case one phase of the activating signal applied to the sensor element at a constant voltage, particularly the zero voltage. Preferably the zero phase of the activating signal is placed at zero. As a result extraneous signals occurring in this phase and which would be particularly interfering on superimposing the zero phase are in easy manner suppressed. Thus, interference is at least partly removed from the signal.

In one embodiment of the invention, the switching means can contain a switch, particularly have a semiconductor component. The semiconductor component can e.g. be a transistor or any other, rapidly reacting component.

According to another embodiment of the invention the activating part has a frequency generator for generating the frequency-modulated activating signal with the operating frequency. The cost of such a frequency generator is not significantly higher than for a generator with a fixed operating frequency, because such generators are of a standard nature in other fields of application.

If for the activation of the signal use is made of two inverting components successively at a random location in the signal path downstream of the frequency generator and upstream of the sensor element, e.g. upstream of a feed capacitor, in which the singly inverted signal at the output of the first inverting component is led to the switch and forms its activation, an automatic coupling of the switch and its function to the operating frequency is ensured. Through the series connection of two inverters, the unchanged acti-vating signal is obtained again at the output of the second inverter. The inverters operate rapidly and reliably and do not constitute a fault source.

For evaluating several signals the evaluating part is provided at its input with a signal multiplexer having at least one input for the connection of at least one output of a sensor part and an output, to which is connected via a signal amplifier a signal evaluating unit, particularly a microcontroller. Therefore only one signal evaluating unit is required for all the sensor elements used and costs are reduced.

According to an embodiment of the invention the circuit arrangement can contain at least one microcontroller, which is inter alia set up for generating the activating signal with the operating frequency for at least one sensor element. Such a software generation makes available a randomly varyable activating signal, which allows a wide range of applications. This permits the economizing of an additional frequency generator, which cuts down costs and reduces fault susceptibility. The microcontroller is advantageously usable for purposes over and beyond frequency generation, such as for the evaluation of the sensor signal or other control functions in an appliance belonging to the touch contact switch.

Preferably a microcontroller contains in a construction the activating part and evaluating part of the circuit arrangement. This further reduces costs and permits a precise evaluation of the signal applied to the sensor element. Advantageously the switching means can be contained in the microcontroller, which are constructed for the short-circuiting of in each case one phase of the activating signal applied to the sensor element at a constant voltage, preferably the zero voltage. This reduces to a minimum the number of necessary components, which has a positive effect on the fault susceptibility. An advantageous measuring method is an AD measurement, the AD conversion taking place by a dual-slope method, single-slope method (with a comparator in the microcontroller), or by its own AD converter. The latter is preferably contained in the microcontroller. Preferably use is made of AD conversion by the dual-slope method.

According to a particularly favourable embodiment of the invention the sensor element is an intrinsically flexible, three dimensionally variable and electrically conductive body and in particular is intended for use in a touch contact switch of a hard glass or glass ceramic cooking field. Preferably it is an electrically conductive foam. The use of such a sensor element for this purpose offers numerous advantages. The sensor element can have material characteristics helping to suppress interfering influences.

Advantageously the body of the sensor element has at least one opening in the direction of the contact faces and in which is contained a lighting element visible through a hard glass or glass ceramic cooking field. Said element can e.g. be a LED, which can indicate the precise position of the contact button.

These and further features can be gathered from the claims, description and drawings and the individual features, either singly or in the form of subcombinations, can be implemented in an embodiment of the invention and in other fields and can represent advantageous, independently protectable constructions for which protection is hereby claimed. The subdivision of the application into individual sections, as well as the intermediate titles in no way restrict the general validity of the statements made thereunder.

BRIEF DESCRIPTION OF THE DRAWINGS

An embodiment of the invention is described hereinafter relative to the drawings, wherein show.

DESCRIPTION OF A PREFERRED EMBODIMENT

Figure 1:
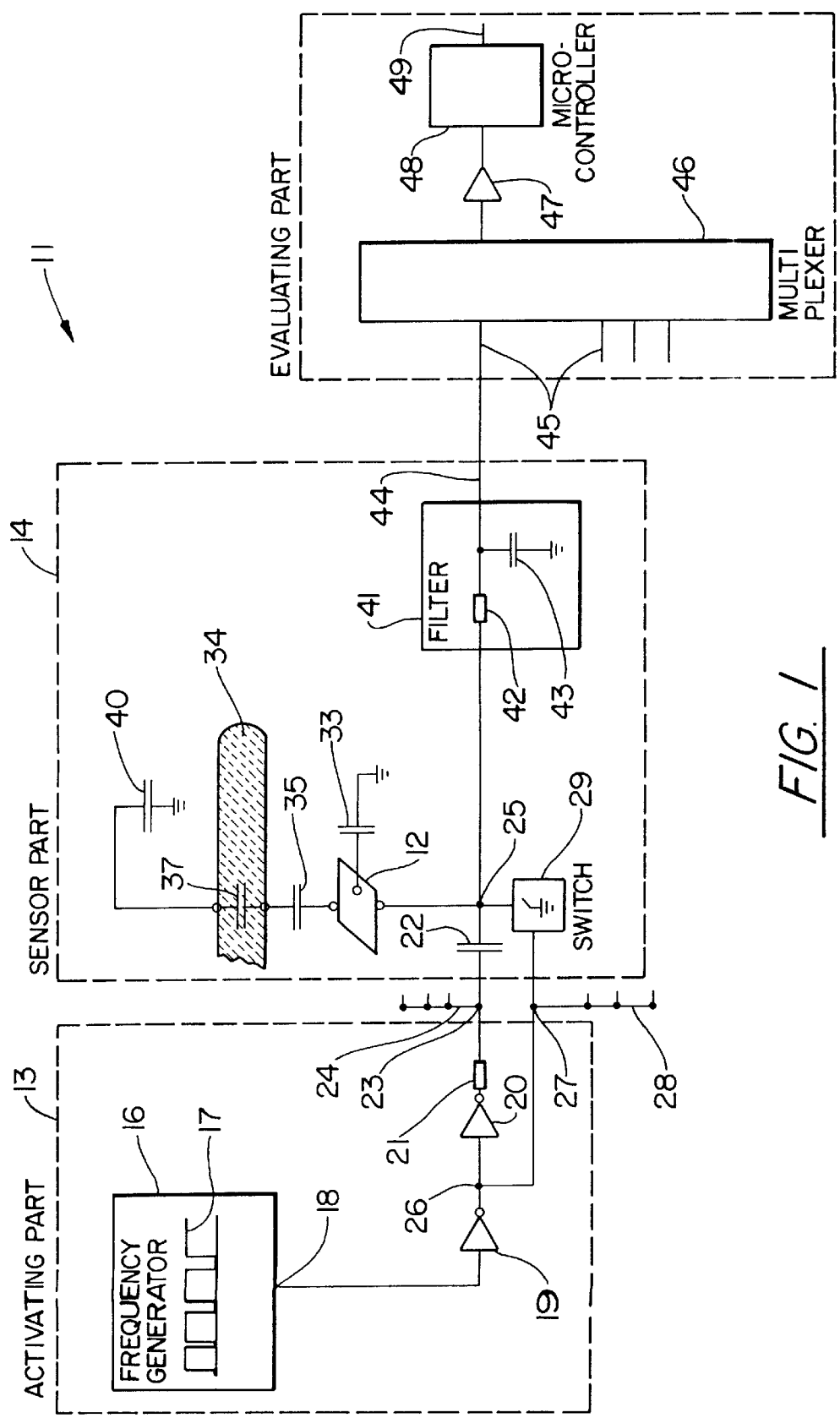
FIG. 1 A circuit arrangement, comprising an activating part, sensor part and evaluating part, with a sensor element fitted to a glass ceramic cooking field FIG. 2 The circuit arrangement with a microcontroller containing the activating part and evaluating part FIGS. 3 to 5 A conventionally used sensor element for installation on a glass ceramic cooking field FIGS. 6 to 8 A novel sensor element according to a feature of the invention for installation on a glass ceramic cooking field

FIG. 1 shows a circuit arrangement 11 for a sensor element 12, which comprises an activating part 13, a sensor part 14 and an evaluating part 15. The activating part 13 contains a frequency generator 16, which generates an activating signal 17 with an operating frequency, which is outputted at an output 18 of the frequency generator 16 and comprises a frequency-modulated square-wave signal. It is conducted to a first inverter 19 and from there to a second inverter 20, after which it passes across a feed resistor 21 to a feed junction 23, from which emanates a first branch line 24 to which can be connected a plurality of sensor parts 14, whereof only one is shown. From the first branch line 24, a connection passes across a feed capacitor 22 to a signal junction 25 in the sensor part 14.

Downstream of the first inverter 19 is provided a branch 26 leading to a switch junction 27, from which emanates a second branch line 28, to which can be connected a plurality of switches 29. Each sensor part 14 contains a switch 29, whose one terminal is connected to the signal junction 25 and whose other terminal is connected to the zero level of the circuit arrangement 11, which is earthed or grounded.

Figure 3:
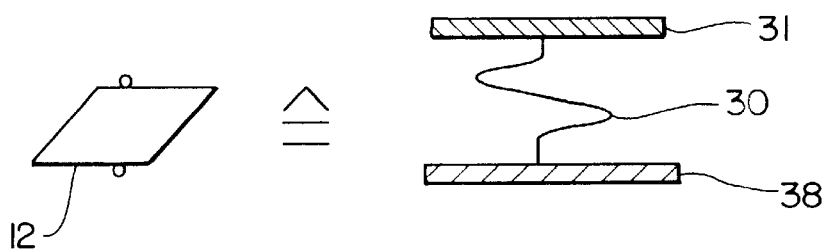
Figure 4:
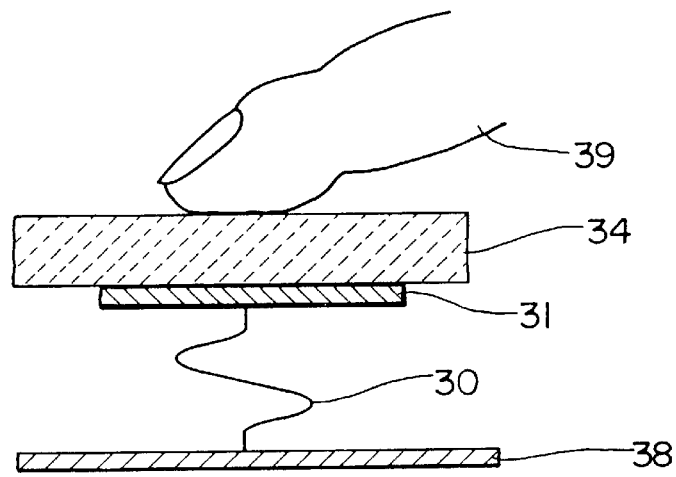
Figure 7:
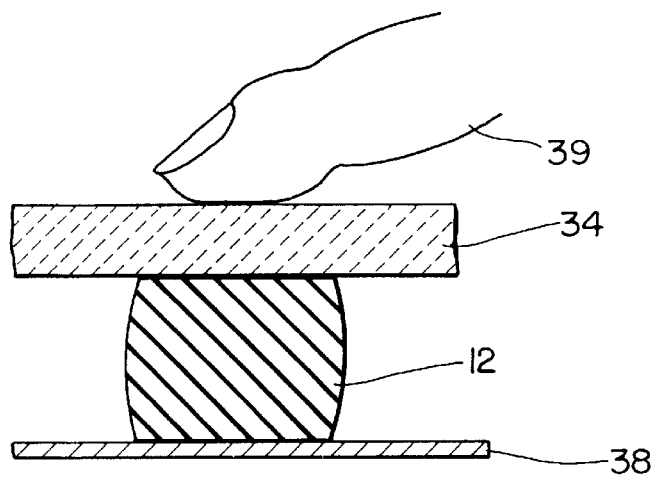

From the signal junction 25 passes a connection for connecting the sensor element 12, the connection being provided by a printed circuit board 38 on which is located the sensor element 12, cf. FIG. 4 or 7. The construction of a sensor element 12 can be gathered from FIG. 3. From the circuit board 23 passes a spring element 30, which must be conductive and is preferably constructed as a metal string, passing in the upwards direction and carrying a sensor circuit board 31, which is pressed by the spring element 30 against a hard glass or glass ceramic cooking field 34. The sensor element 12 has a stray capacitor 33, which is grounded.

Figure 5:
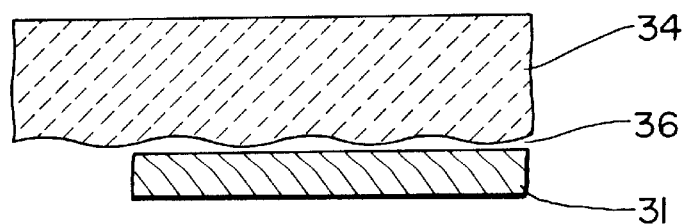

Through the mechanical coupling of the sensor element 12 to the glass ceramic cooking field 34 an air gap capacitor 35 is formed, because the coupling through a knob system 32, resulting from the manufacturing process, on the underside of the field 34 is provided with an air gap 36, shown in enlarged form in FIG. 5.

The capacitance of the glass ceramic cooking field 34 is represented by a glass capacitor 37. FIG. 4 shows a finger 39, which contacts the glass ceramic cooking field 34 above the sensor element 12, so that to the glass capacitor 37 is added a serial finger capacitor 40, which is grounded.

From the signal junction 25 a connection passes to a filter 41, which is constructed as a R-C filter from a serial filter resistor 42 and a filter capacitor 43, which is grounded. A connection passes from the filter 41 to an output 44 of the sensor part 14.

This output 44 of the sensor part 14 passes to one of several inputs 45 of a signal multiplexer 46. The signal multiplexer 46 is connected by means of a signal amplifier 47 to a signal evaluating unit, particularly a microcontroller 48. These three components form the evaluating part 15, to which can be connected the same number of sensor parts 14 as the signal multiplexer has inputs. The microcontroller is connected by an output 49 to a not shown part of a circuit, which transforms instructions generated by the microcontroller, e.g. for turning on or off the power of an electric cooker.

Figure 2:
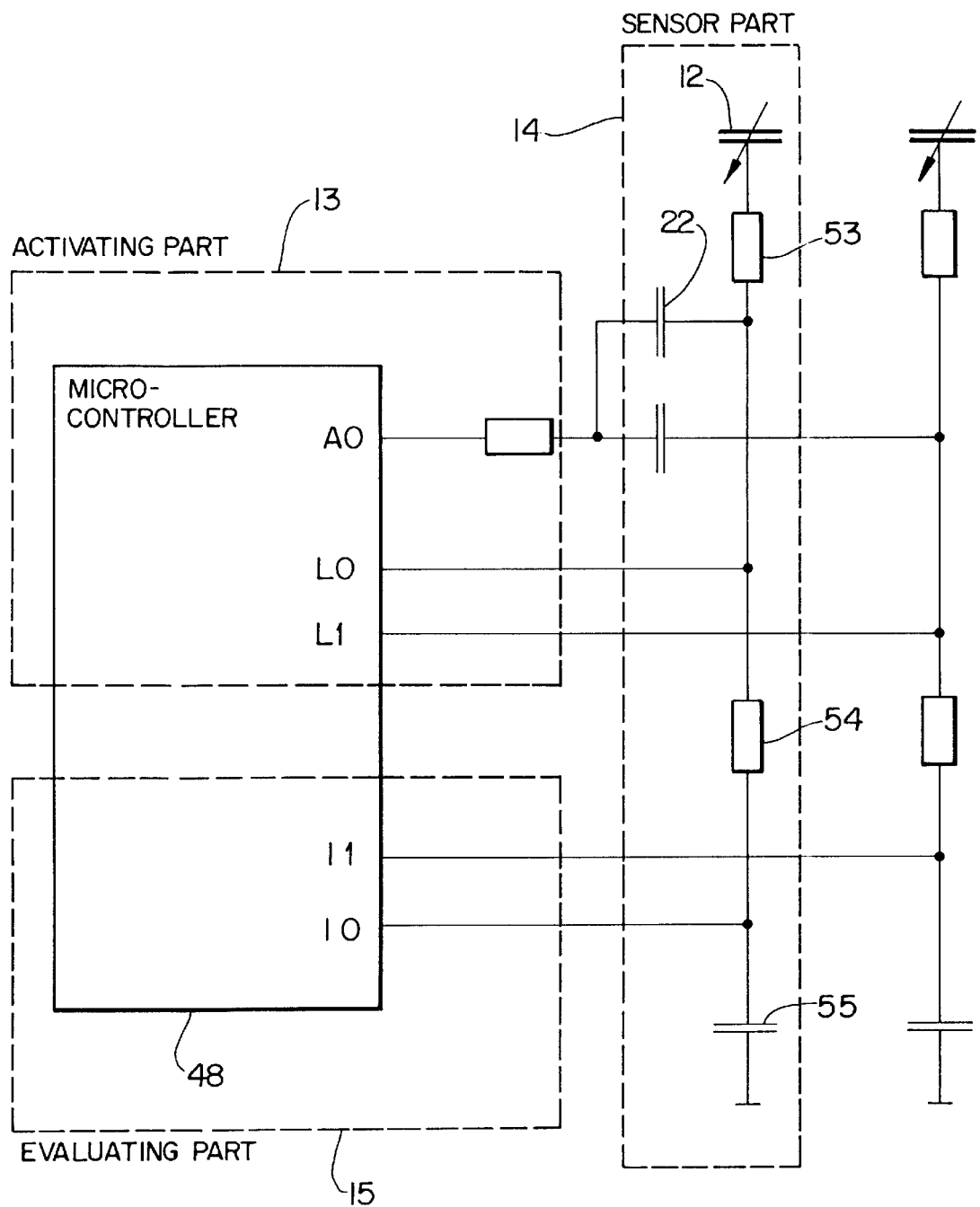

FIG. 2 shows an embodiment with the generation of the activating signal in the microcontroller 48. The activating signal 17 is passed to the sensor element 12 across the terminal AO, a common series resistor and in each case individual feed capacitors 22 and resistors 53. FIG. 2 shows the sensor element 12 as a variable capacitor, the capacitance change resulting from contact with the contact switch. Simultaneously, across the resistors 53, the sensor elements 12 with the further resistors 54 and capacitors 55 are grounded.

The terminals LO and L1 in each case serve for the discharging of the capacitors 55, which form RC-elements with the resistors 54. The evaluation of the activating signal 17 applied to a sensor element 12 takes place by means of connections of the terminals 10 and Il to the capacitors 55 of the RC-element.

As shown, the microcontroller 48 combines both the activating part 30 and the evaluating part 15. The sensor part 14 is formed by the sensor elements 12, as well as the feed capacitors 22, resistors 53, 54 and capacitors 55. As a function of the type of microcontroller 48 used, a varying number of sensor parts 14 or sensor elements 12 can be operated.

Figure 6:
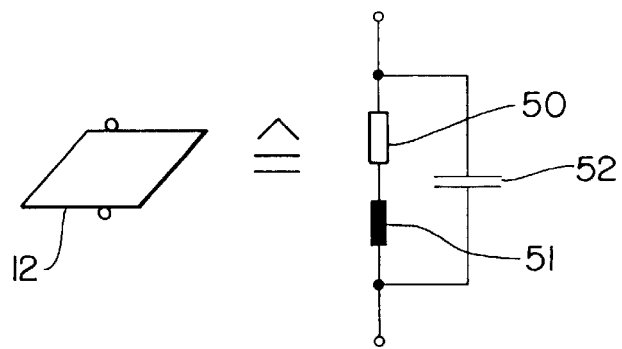

An equivalent circuit of a sensor element 12 made from electrically conductive, flexible foam is shown in FIG. 6. It can be represented by a parallel connection of an equivalent resistor 50 with a serial, inductive resistor 51 and a parallel capacitor 52.

Figure 8:
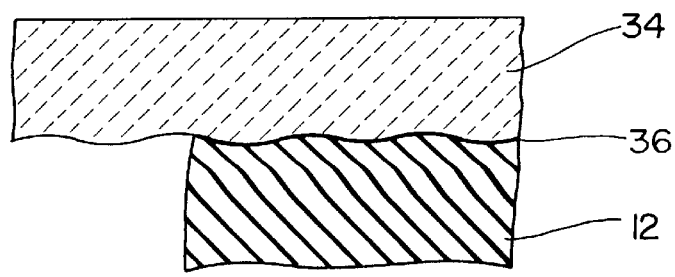

FIG. 7 shows a sensor element 12, which is made from electrically conductive, flexible foam, fitted between the printed circuit board 38 and glass ceramic cooking field 34. FIG. 8 shows that the sensor element 12 is so well adapted to the knobbed underside of the glass ceramic cooking field 34 that the occurrence of an air gap 36 is prevented.

FUNCTION

Reference will firstly be made to the construction with the frequency generator. The circuit is in accordance with the diagram of FIG. 1, preferably in SMD technology and is formed on the printed circuit board 38, which also constitutes the support and also the terminal for the sensor element 12. The use of a 5 V signal level has the important advantage that only one 5 V voltage supply is needed, because this is the operating voltage of the signal multiplexer 46 and the microcontroller 48.

The frequency generator 16 firstly generates a square-wave signal with a 5 V signal level, a make-to-break ratio of approximately 70 to 95% and a frequency of 20 to 500 kHz. This square-wave signal is frequency-modulated with a modulation frequency of 20 to 1000 Hz, namely between values of typically 5 to 50 kHz, so that the activating signal 17 is obtained.

The first inverter 19 is required for activating the switch 29. When the activating signal 17 returns to zero, it is inverted by inverter 19 and brought to 5 V and as a result the switch 29 is activated and closes the signal junction 55 to ground. Thus, the signal at the signal junction 25 is always zero when the activating signal 17 is zero, so that during this time interference is suppressed. Through the second inverter 20, behind the first, the original output signal 17 is again produced. This passes across the feed resistor 21 and branch lines 24 to the feed capacitor 22.

In the unoperated state the sensor element 12 only has its stray capacitor 03, which forms with the feed capacitor 22 a voltage divider for the output signal applied to the feed capacitor. The feed capacitor 22 can be so dimensioned that at the sensor element 12 is applied half the voltage, i.e. the feed capacitance is roughly as high as the stray capacitor 33. On operating the touch contact switch, parallel to the stray capacitor 33 are added the air gap capacitor 35, glass capacitor 37 and finger capacitor 40, which are connected in serial. As a result of this parallel connection the overall capacitance of the sensor element 12 is higher, the division ratio of the total capacitance to the capacitance of the feed capacitor 22 changes and the voltage at the sensor element and therefore at the signal junction 25 drops. At the output of the filter 41 connected to the signal junction 25 there is a d.c. voltage, which is only dependent on the given signal level, the make-to-break ratio, which is known and invariable, and the sensor voltage, which is dependent on the operating state of the touch contact switch.

This d.c. voltage is supplied to a signal multiplexer 46, which selects one of several d.c. voltages from several sensor circuits 14 and supplies same to a microcontroller 48 across a signal amplifier 47. The microcontroller 48 evaluates the d.c. voltage and detects whether or not the touch contact switch has been operated. Evaluation is preferably such that over a certain time period, corresponding to a frequency range covered in this time period, evaluation takes place e.g. in a summating or integrating manner. Only when there has been a d.c. voltage change over and beyond this time, should the evaluation indicate an operation. If now a spurious signal with a fixed frequency occurs, if at all, the d.c. voltage only changes for an instant and is unimportant within the time provided for the evaluation. Dependent on a detection, the microcontroller supplies at its output 49 instructions to a further circuit, e.g. the control circuit for a cooking field heating.

The equivalent resistor 50 with the feed capacitor 22 and stray capacitor 33 forms a filter, which attenuates the coupling in of spurious signals via the finger 39 on operating the touch contact switch. In order to make the material of the sensor element 12 conductive, it is possible to admix various materials, e.g. graphite, silver, etc. If instead of this or in addition thereto ferritic materials are admixed, the inductive resistor 51 is obtained, which leads to a further spurious signal attenuation improvement. It is particularly advantageous to use a sensor element shown and represented in the simultaneously filed patent application A 32 292 US entitled "Touch contact switch with sensor button". Thus, with such a sensor element a particularly advantageous implementation of the invention can be obtained. It can also be used in both versions for generating the activating signal.

In the construction according to FIG. 2 the sensor element 12 is controlled in the following way. Firstly the RC-element formed by resistor 54 and capacitor 55 is discharged across the terminal LO. Then the capacitor 55 is charged across the terminal LO until a logic high level is measured at input 10. In practice this occurs when the capacitor 55 has been charged to the general operating voltage of 5 V.

In the third step at terminal AO for a specific time period is generated the activating signal 17 with the inventive modulation or frequency modulation and consequently the capacitor 55 is discharged across the resistor 54. The activating signal can substantially coincide with the construction having the frequency generator. In this phase the terminal LO is switched prior to each change of the signal from low to high at AO in high ohmic manner and before the change from high to low at AO in low ohmic manner against the zero voltage. Thus, in this construction grounding takes place during the zero phase of the activating signal.

In the fourth step the RC-element of resistor 54 and capacitor 55 is again charged across the terminal LO. The time up to which the signal at terminal IO changes to high level is measured. As indicated above, the AD conversion of the signal applied to the terminal IO or I1 preferably takes place in the dual-slope method. The evaluation of the voltage applied to the sensor element preferably takes place dynamically, so that a temperature drift of the signal level can be compensated.

As in the embodiment according to FIG. 1, the change to the activating signal 17 is brought about by contacting the sensor element 12 fed by it. The resulting switching process can take place in precisely the same way.

We claim:

1. A circuit arrangement for at least one sensor element of at least one touch contact switch, in which an activating signal with an operating frequency is applied to the sensor element and is variable as a function of an operating state of the sensor element and the activating signal is modulated, the circuit arrangement comprises:
    at least one activating part, the activation part comprises a frequency generator for generating the activating signal with the operating frequency;
    at least one sensor part with an output;
    at least one evaluating part; and,
    switching means constructed for short-circuiting in each case one phase of the activating signal applied to the sensor element at a constant voltage.

2. Circuit arrangement according to claim 1, wherein the activating signal is frequency-modulated with an operating frequency.

3. Circuit arrangement according to claim 1, wherein each sensor element is provided with an associated sensor part.

4. Circuit arrangement according to claim 2, wherein the operating frequency with a fixed modulation frequency sweep is variable between a minimum value and a maximum value, the minimum value being approximately 5 kHz and the maximum value being approximately 50 kHz.

5. Circuit arrangement according to claim 4, wherein the modulation frequency is approximately 20 to 1000 Hz.

6. Circuit arrangement according to claim 1, wherein the activating signal is a square-wave signal.

7. Circuit arrangement according to claim 1, wherein a component forms a first part of a voltage divider with two parts, the sensor element forming a second part of the voltage divider.

8. Circuit arrangement according to claim 7, wherein the voltage divider is a capacitive voltage divider and a feed capacitor forms the first part of said capacitive voltage divider.

9. Circuit arrangement according to claim 7, wherein the component forming the first part of the voltage divider is contained in the sensor part.

10. Circuit arrangement according to claim 1, wherein a filter is connected upstream of the output of the sensor part.

11. Circuit arrangement according to claim 1, wherein two inverting components are provided in succession at a random point in the signal path downstream of the frequency generator and upstream of the sensor element, in which the inverted signal following the first inverting component at the output of said component is conducted to the switching means and is responsible for the activation thereof.

12. Circuit arrangement according to claim 1, wherein the switching means contain a switch with a semiconductor component.

13. Circuit arrangement according to claim 1, wherein the evaluating part contains a signal multiplexer that is provided with at least one input for the connection of at least one output of a sensor part and an output connected to a signal evaluating unit by a signal amplifier.

14. Circuit arrangement according to claim 1, wherein the sensor element is an intrinsically flexible, three dimensionally variable and electrically conductive body and is provided for use in a touch contact switch of a hard glass or glass ceramic cooking field.

15. Circuit arrangement according to claim 14, wherein the sensor element is made of electrically conductive foam.

16. Circuit arrangement for at least one sensor element of at least one touch contact switch, in which an activating signal with an operating frequency is applied to the sensor element and is variable as a function of an operating state of the sensor element and the activating signal is modulated, wherein the circuit arrangement comprises:
    at least one activating part;
    at least one sensor part with an output;
    at least one evaluating part;
    at least one sensor element;
    at least one microcontroller for generating at least the activating signal with the operating frequency for the at least one sensor element; and,
    switching means constructed for short-circuiting in each case one phase of the activating signal applied to the sensor element at a constant voltage.

17. Circuit arrangement according to claim 16, wherein the activating signal is frequency-modulated with an operating frequency.

18. Circuit arrangement according to claim 16, wherein each sensor element is provided with an associated sensor part.

19. Circuit arrangement according to claim 17, wherein the operating frequency with a fixed modulation frequency sweep is variable between a minimum value and a maximum value, the minimum value being approximately 5 kHz and the maximum value being approximately 50 kHz.

20. Circuit arrangement according to claim 19, wherein the modulation frequency is approximately 20 to 1000 Hz.

21. Circuit arrangement according to claim 16, wherein the activating signal is a square-wave signal.

22. Circuit arrangement according to claim 16, wherein a component forms a first part of a voltage divider with two parts, the sensor element forming a second part of the voltage divider.

23. Circuit arrangement according to claim 22, wherein the voltage divider is a capacitive voltage divider and a feed capacitor forms the first part of said capacitive voltage divider.

24. Circuit arrangement according to claim 22, wherein the component forming the first part of the voltage divider is contained in the sensor part.

25. Circuit arrangement according to claim 16, wherein a filter is connected upstream of the output of the sensor part.

26. Circuit arrangement according to claim 16, wherein the evaluating part contains a signal multiplexer, that is provided with at least one input for the connection of at least one output of a sensor part and an output connected to a signal evaluating unit by a signal amplifier.

27. Circuit arrangement according to claim 16, wherein the activating part and the evaluating part are contained in the microcontroller.

28. Circuit arrangement according to claim 16, wherein the switching means are provided in the microcontroller.

29. Circuit arrangement according to claim 16, wherein the sensor element is an intrinsically flexible, three dimensionally variable and electrically conductive body and is provided for use in a touch contact switch of a hard glass or glass ceramic cooking field.

30. Circuit arrangement according to claim 29, wherein the sensor element is made of electrically conductive foam.

* * * * *